US006599361B2

(12) United States Patent
Tang et al.

(10) Patent No.: US 6,599,361 B2
(45) Date of Patent: Jul. 29, 2003

(54) GAN SELECTIVE GROWTH ON SIC SUBSTRATES BY AMMONIA-SOURCE MBE

(75) Inventors: Haipeng Tang, Orleans (CA); James B. Webb, Manotick (CA); Jennifer A. Bardwell, Ottawa (CA)

(73) Assignee: National Research Council of Canada, Ottawa (CA)

( * ) Notice: Subject to any disclaimer, the term of this patent is extended or adjusted under 35 U.S.C. 154(b) by 0 days.

(21) Appl. No.: 09/882,048

(22) Filed: Jun. 18, 2001

(65) Prior Publication Data

US 2002/0189534 A1 Dec. 19, 2002

(51) Int. Cl.[7] ............................ C30B 23/00; C30B 23/04
(52) U.S. Cl. ........................ 117/84; 117/105; 117/108; 117/88; 117/103; 117/92
(58) Field of Search ................................. 117/105, 108, 117/84; 438/460, 481, 706, 712, 44

(56) References Cited

U.S. PATENT DOCUMENTS

| 5,210,051 A | * | 5/1993 | Carter, Jr. ................... 117/105 |
| 5,670,798 A | * | 9/1997 | Schetzina ..................... 257/96 |
| 6,139,629 A | * | 10/2000 | Kisielowski et al. ........ 117/105 |
| 6,261,929 B1 | * | 7/2001 | Gehrke et al. ............... 438/462 |
| 6,271,104 B1 | * | 8/2001 | Razeghi et al. ............. 438/481 |
| 6,380,108 B1 | * | 4/2002 | Linthicum et al. .......... 257/103 |

OTHER PUBLICATIONS

Tang, H and Webb, James, "Growth of high mobility GaN by ammonia–molecular beam epitaxy". Apr. 19, 1999. Applied Physics Letters vol. 74, No. 16. pp. 2373–2374.*

"InGaN/GaN/AlGaN–based laser diodes with modulation–doped strained–layer superlattices grown on an epitaxially laterally overgrown GaN substrate", Shuji Nakamura et al., Appl. Phys. Lett., 72(2), Jan. 12, 1998, pp. 211–213.

"Pendeoepitaxy of gallium nitride thin films", Kevin Linthicum et al, Appl. Phys. Lett., vol. 75, No. 2, Jul. 12, 1999, pp. 196–198.

* cited by examiner

Primary Examiner—Robert Kunemund
Assistant Examiner—Matthew Song
(74) Attorney, Agent, or Firm—Marks & Clerk

(57) ABSTRACT

A method is described for selectively depositing a GaN epitaxial layer on a substrate. The substrate is first patterned with a seed layer, preferably of AlN, and then the GaN epitxial layer is grown on the resulting patterned substrate by molecular beam epitaxy (MBE) such that growth occurs selectively over the seed layer.

16 Claims, 2 Drawing Sheets

GAN SELECTIVE GROWTH ON SIC SUBSTRATES BY AMMONIA-SOURCE MBE

BACKGROUND OF THE INVENTION

1. Field of the Invention

This invention relates to the field of molecular beam epitaxy (MBE), and in particular to a method of achieving GaN epitaxial selective growth and lateral overgrowth on a substrate.

2. Description of Related Art

Gallium nitride epilayers are becoming increasingly important in the manufacture of a number of devices. GaN epilayers are, for example, the crucial technology used for achieving robust CW blue lasers with long lifetime. Selectively grown GaN stripes, prisms and pyramids with their characteristically smooth facets or well defined ridges are ideal candidates for forming optical microcavity, optical waveguides, and InGaN quantum dot structures.

The selective growth of GaN has been demonstrated using the metalorganic chemical vapor deposition (MOCVD) technique and successfully used in a variety of applications over the past four or five years. The epitaxial lateral overgrowth enabled by this selective growth process has been shown to bring a dramatic reduction by many orders of magnitude of the threading dislocation density in GaN epilayers.

MOCVD is however a complicated technique and it would be desirable to achieve selective growth by the molecular beam epitaxy (MBE) technique. This, however, has proved to be generally much harder than by vapor-phase-based growth processes such as the MOCVD technique. Gas phase precursors are generally much more selective to substrate materials in terms of adsorption, cracking and incorporation than simple atoms effused from an MBE cell. Earlier studies of GaN growth on patterned SiC substrates using plasma-source MBE, and on patterned Si substrates using ammonia-source MBE found no evidence of growth selectivity. However, a recent work by V. K. Gupta, K. L. Averett, M. W. Kock, B. L. Mcintyre, and G. W. Wicks J. Electron. Mater. 29, 322(2000) using ammonia-source MBE examined the difference in ammonia cracking efficiencies on various material surfaces and showed evidence of selective growth with a $SiO_2$ mask. Also, MBE has in the past been associated with significant surface roughness, and this can preclude many possible device applications.

The quality of GaN materials grown by the ammonia-MBE technique has seen a significant improvement in the past few years, and is now comparable to the best-grown MOCVD layers. For example, this technique produced a GaN bulk layer on sapphire with a mobility of 560 $cm^2$/Vs at 300 K (n~$1.5 \times 10^{17}$ $cm^{-3}$), and an AlGaN/GaN layer on SiC with a record mobility of 11000 $cm^2$/Vs at 77 K ($n_s$~$3.2 \times 10^{12}$ $cm^{-2}$). However, GaN epilayers prepared by this technique generally show a significant surface roughness associated with the sizes of the columnar structures defined by the density of threading dislocations, and these can compromise the performance of certAlN types of devices. Therefore, the characteristics of selective growth such as extremely flat facets and dramatic reduction in threading dislocations through lateral overgrowth would be highly desirable if feasible with the ammonia-MBE technique.

SUMMARY OF THE INVENTION

According to the present invention there is provided a method of selectively depositing a GaN epitaxial layer on a substrate, comprising patterning the substrate with a seed layer; and growing the GaN epitaxial layer by molecular beam epitaxy (MBE) on the patterned substrate such that growth occurs selectively over the seed layer.

The substrate is typically SiC and the seed layer is preferably AlN. In accordance with the invention, excellent selective growth of GaN on a SiC substrate by ammonia-MBE has been observed. This occurs preferentially from the patterned AlN seed layer and uses the unseeded SiC surface as a pseudo mask.

The difficulty of GaN nucleation on SiC surface has been widely observed in the MOCVD processes. A similar and total absence of nucleation on a bare SiC substrate with the ammonia-MBE process was observed even after a three-hour growth period. This is in contrast to the nearly instant nucleation of GaN on sapphire substrates found under typical ammonia-MBE growth conditions. However, when the thin (a few hundred Å) AlN seed/buffer layer is deposited first on the SiC substrate, the subsequent GaN growth occurrs instantly as could be seen by in situ laser reflectance measurement.

The AlN seed layer is preferably pre-deposited on the SiC surface using the magnetron sputter epitaxy techniqne (or MEE) and patterned into parallel stripes by photolithography and chemically assisted ion beam etching. Evidence of lateral overgrowth can be observed by scanning electron microscopy and x-ray diffraction studies. The GaN stripes grown show extremely smooth side facets due to the lateral growth.

The lack of gas diffusion may be offset by enhancing atoms' surface mobility through optimizing ammonia flow rate and/or using certain surfactants during growth.

BRIEF DESCRIPTION OF THE DRAWINGS

The invention will now be described in more detail, by way of example, only with reference to the accompanying drawings, in which.

DETAILED DESCRIPTION OF THE PREFERRED EMBODIMENTS

EXAMPLE

The growth system was a custom-built system operational for both molecular beam epitaxy and magnetron sputter epitaxy using ammonia as the nitrogen source. The magnetron sputter epitaxy technique was used for depositing AlN buffer layers on sapphire or SiC substrates for the subsequent growth of high quality GaN layers by ammonia-MBE.

Such a technique is, for example, described in Appl. Phys. Lett 74, 2373 (1999), H. Tang and J. B. Webb, the contents of which are herein incorporated by reference.

The substrate used for the selective growth experiment was a 4H-SiC (0001) wafer with Si-terminated surface. The size of the substrate was a quarter of a 2" wafer. The wafer was back-coated with Mo, degreased with chloroform, dipped in 10% HF for 1 minute, thoroughly rinsed and blown dry with nitrogen. No hydrogen surface treatment was applied. The substrate was mounted indium free on a Mo holder that allows direct radiative heating of the substrate with a graphite heater. The SiC substrate was first nitrided at 1000° C. for 10 minutes under 100 sccm ammonia, then cooled down to 860° C. At this temperature, a 300 Å AlN buffer layer was deposited by magnetron sputter epitaxy at a rate of 1Å/s using 60 sccm argon, 15 sccm ammonia, and a dc power of 50 watts.

The SiC wafer coated with AlN was then patterned using photolithography to form an array of parallel AlN stripes (7 $\mu$m in width), spaced 3 $\mu$m apart where the AlN seed layer was to be etched away. The stripes were along the [1-210] crystalline direction. Chemically assisted ion beam etching was employed to remove the AlN layer in the gap area, and etch about 1000 Å further into the SiC substrate.

The patterned substrate was thoroughly cleaned and reintroduced into the growth chamber for the selective growth using the ammonia-MBE technique. Growth was started as soon as the substrate was heated to the growth temperature (920° C.) under an ammonia flow rate of 50 sccm. No substrate rotation was used in this experiment. There was thickness non-uniformity resulting from lack of sample rotation and from an unavoidable temperature gradient across the quarter 2" wafer. The thickness ranged from 0.8 $\mu$m in the thinnest part to 1.5 $\mu$m in the thicker part of the layer, with an average growth rate of 0.6 $\mu$m/hr. The substrate temperature was about 20~30 degrees lower near the edge of the quarter wafer than at the center.

Figure 1:
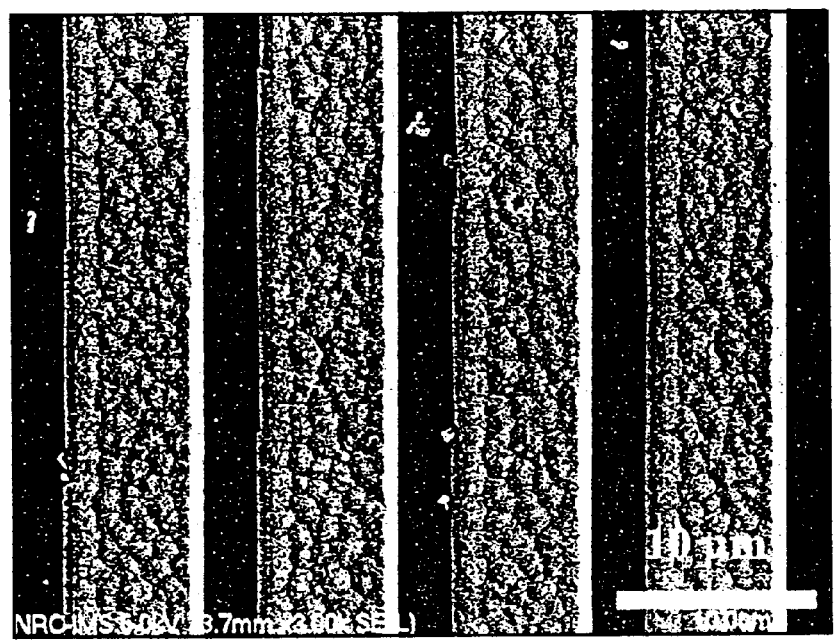
FIG. 1 is an SEM (Scanning Electron Microscope) plan view micrograph of GaN selectively grown by ammonia-MBE on an SiC substrate patterned with AlN seed layer stripes 7 μm in width and spaced 3 μm apart where Sic was recessed and unseeded.

Excellent growth selectivity was observed over the whole area of the substrate despite the variation in growth rate and temperature, indicating that selective growth can be maintained over a relatively wide range of growth conditions. It can be clearly seen from FIG. 1 that there is no nucleation in the SiC exposed regions between the AlN seeded GaN stripes.

Figure 2:
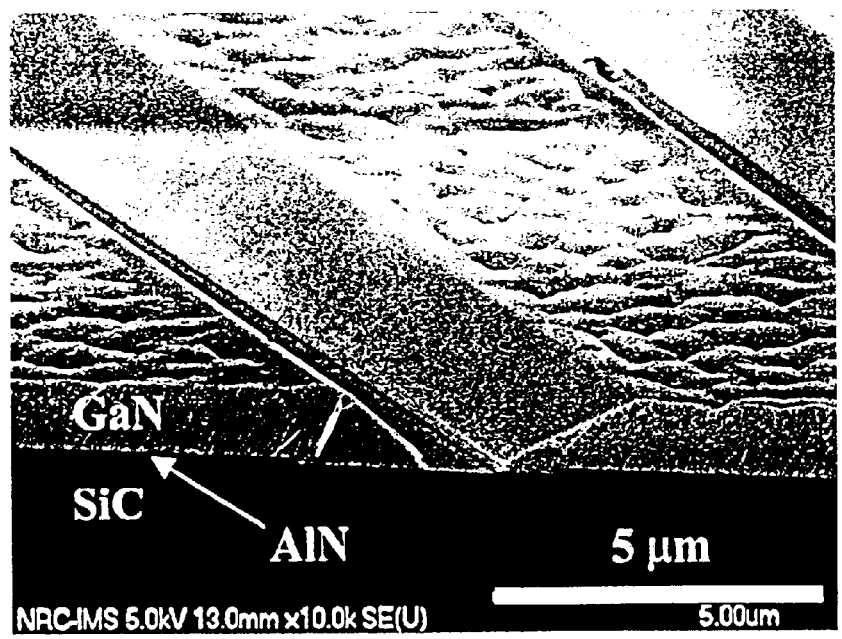
FIG. 2 is an SEM (Scanning Electron Microscope) view micrograph of GaN selectively grown by ammonia-MBE on an SiC substrate patterned with AlN seed layer stripes. The sample is cleaved along the (1-100) cleavage plane. The cross section is at a 60 degree angle with respect to the stripes.

In FIG. 2, the AlN seed layer can be seen as a thin dark contrast between the GaN stripes and the SiC substrate. The etch profile of the exposed SiC area is also delineated in the cross sectional image. A significant lateral growth over the exposed SiC surface in the gap area is clearly seen, resulting in extremely smooth facets on the sides of the GaN stripes. This is in sharp contrast to the granular morphology in the area seeded with AlN. The granular morphology is associated with the columnar growth initiated directly from the AlN buffer layer with large lattice mismatch.

The amount of lateral overgrowth appears to be unequal at the two opposite edges of the GaN stripe. It is believed that this is due to the shadowing effect with respect to the Ga beam, since the substrate was not rotated and was at an angle with the Ga beam during growth. The cleaving features also seem to show columnar structures oriented towards the side where the lateral growth is more significant, which could mean that this orientation is facing the Ga beam. These columnar features, (resulting from cleaving), appear to be missing in the laterally grown part of the stripe. From the SEM images, the laterally grown material appears to be in close contact with the recessed SiC surface, rather than being suspended above it. This may be because the etching depth is still small, only about 1000 Å. The close contact with the SiC substrate can be an advantage in that devices realized on the laterally overgrown material can still benefit from the superb thermal conductivity of the SiC substrate.

Figure 3:
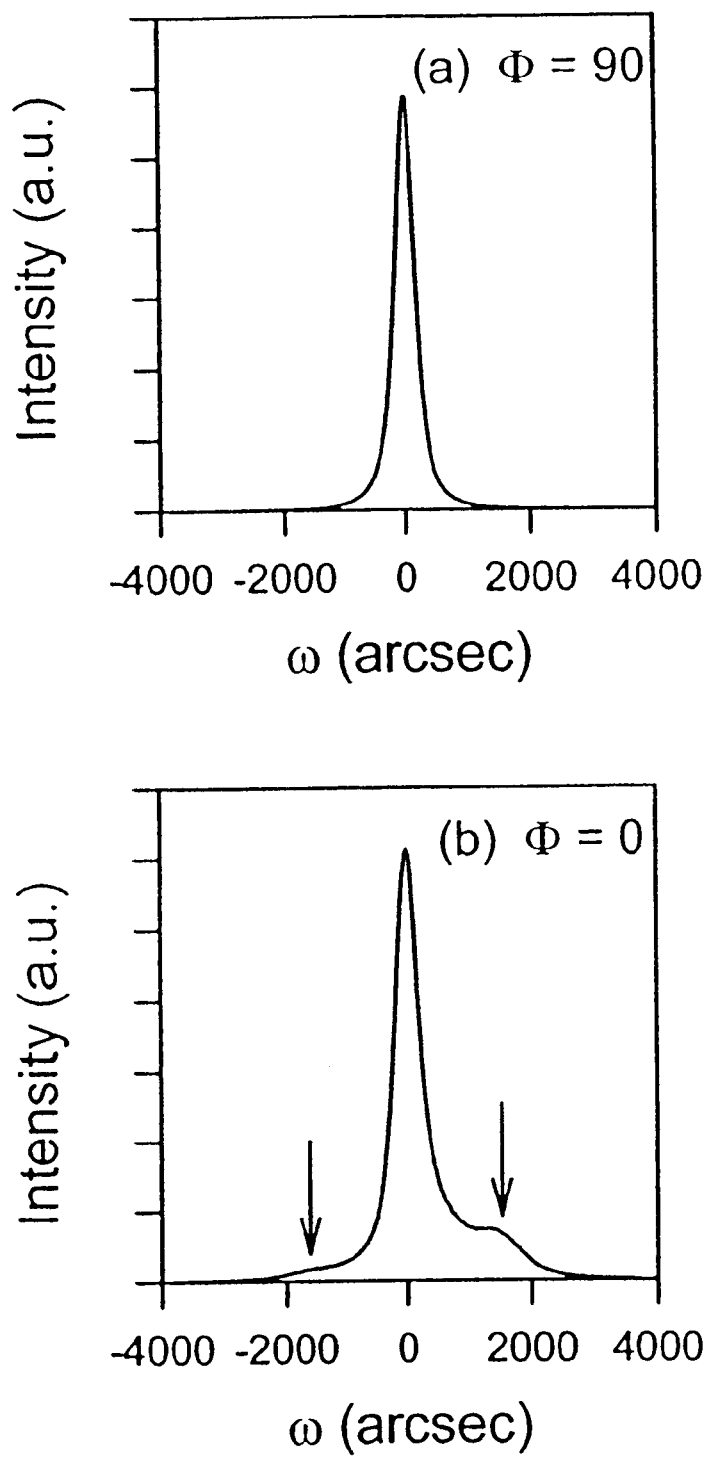
FIG. 3 shows X-ray double crystal rocking curves of the (0002) reflection of the selectively grown GaN sample measured a) with the crystal rocking parallel to the stripes (i.e. ω axis perpendicular to the stripes, Φ=90°); and b) with the crystal rocking perpendicular to the stripes (i.e. ω axis parallel to the stripes, Φ=0°).

FIG. 3 shows the X-ray double crystal rocking curves ($\omega$ scan) of the (0002) reflection of the selectively grown GaN sample. The X-ray diffraction spectra show clear evidence of an unequal amount of lateral overgrowth on both sides of the GaN stripe. The rocking curve taken with the rocking plane perpendicular to the stripes shows a main peak corresponding to the direct vertical growth from the AlN seed layer, and two additional peaks on each side arising from the laterally grown wings. The dominant intensity of the main peak is because the seeded growth takes up most of the volume in this sample. The intensities of the two side peaks are asymmetric, confirming the SEM observation of unequal lateral growth on the two sides. Both lateral growth peaks are tilted about 0.3 degree from the seeded growth peak. This tilt is very similar to that found in epitaxially lateral overgrown material prepared by MOCVD. As expected, the rocking curve taken parallel to the GaN stripes shows no tilt peaks.

Growth conditions favorable to lateral growth are generally those that enhance the surface mobility of the Ga adatoms. High growth temperature, low ammonia flux as well as the use of certain surfactants were found to be effective for achieving a high lateral growth rate in MOCVD. In addition, the lateral growth in MOCVD processes is also aided by the diffusion of precursors in the gas phase. Lacking the possibility of any significant gas phase diffusion, the lateral growth using the ammonia-MBE technique relies on the surface mobility of the Ga atoms.

The invention permits the selective growth and lateral overgrowth of GaN on SiC substrates with a patterned AlN seed layer using the ammonia-MBE technique. The flat facetted growth characteristic of the selective lateral growth provide a solution to several major disadvantages such as the surface roughness and columnar growth, typical of the GaN MBE techniques. The lateral growth by ammonia-MBE can be further optimized by approaches such as minimizing or pulsing the ammonia flux. With such features as the selective growth and lateral overgrowth demonstrated, the ammonia-MBE technique has the potential to be a competitive alternative to MOCVD while still retaining the unique advantages of the MBE technique. The invention promises to enable many device applications that would otherwise be infeasible with the MBE method.

Although the present invention has been described and illustrated in detail, it is clearly understood that the same is by way of illustration and example only and is not to be taken by way of limitation, the spirit and scope of the invention being limited only by the terms of the appended claims.

We claim:

1. A method of selectively depositing a GaN epilaxial layer on a substrate, comprising:

selecting SiC as said substrate;

growing an AlN seed layer on said substrate;

patterning said AlN seed layer to expose portions of said substrate; and depositing said GaN epitaxial layer by ammonia-molecular beam epitaxy (MBE) on said SiC substrate such that growth occurs selectively on said patterned seed layer.

2. A method as claimed in claim 1, wherein said seed layer is about 300Å thick.

3. A method as claimed in claim 1, wherein said seed layer is deposited using magnetron sputter epitaxy, or by MBE.

4. A method as claimed in claim 3, wherein said seed layer is patterned by photolithography and chemically assisted ion beam etching.

5. A method as claimed in claim 4, wherein the ion beam etching is continued into said exposed substrate of SiC.

6. A method as claimed in claim 1, wherein the substrate is heated to a predetermined temperature prior to growth of the GaN layer.

7. A method as claimed in claim 6, wherein said predetermined temperature is about 920° C.

8. A method as claimed in claim 1, wherein lateral overgrowth of said GaN layer is achieved by enhancing surface mobility of Ga atoms.

9. A method as claimed in claim 6, wherein the surface mobility of Ga atoms is enhanced by optimizing ammonia flow rate.

10. A method as claimed in claim 7, wherein the surface mobility of Ga atoms is enhanced by adding surfactants during growth of the GaN layer.

11. A method as claimed in claim 1, wherein said growing of said GaN epitaxial layer by ammonia-source based molecular beam epitaxy (MBE) is continued to achieve lateral overgrowth.

12. A method as claimed in claim 11, wherein growth conditions are selected to enhance surface mobility of Ga atoms.

13. A method as claimed in claim 12, wherein ammonia flow rate is optimized to enhance lateral overgrowth.

14. A method as claimed in claim 11, wherein the ammonia flow rate is about 50 sccm.

15. A method as claimed in claim 1, wherein said seed layer is patterned by photolithography and chemically assisted ion beam etching.

16. A method as claimed in claim 15, wherein the ion beam etching is continued into said exposed substrate.

* * * * *